(12) United States Patent
Sugihara et al.

(10) Patent No.: US 6,633,045 B1
(45) Date of Patent: Oct. 14, 2003

(54) ASSEMBLY PART WITH WIRING AND FOR MANUFACTURING SYSTEM, METHOD OF MANUFACTURING SUCH ASSEMBLY PART, AND SEMICONDUCTOR MANUFACTURING SYSTEM CONSTITUTED USING ASSEMBLY PART

(75) Inventors: Kazuyoshi Sugihara, Kanagawa-ken (JP); Atsushi Ando, Tokyo (JP); Katsuya Okumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 364 days.

(21) Appl. No.: 09/667,521

(22) Filed: Sep. 22, 2000

(30) Foreign Application Priority Data

Sep. 24, 1999 (JP) .......................... P11-271336

(51) Int. Cl.⁷ ................................. G21G 5/00
(52) U.S. Cl. ................................. 250/492.1
(58) Field of Search .................. 250/396 R, 492.1, 250/492.2, 492.3

(56) References Cited

U.S. PATENT DOCUMENTS

| | | | | |
|---|---|---|---|---|
| 4,200,794 A | | 4/1980 | Newberry et al. | 250/396 |
| 4,764,413 A | * | 8/1988 | Nukii et al. | 428/192 |
| 4,796,084 A | * | 1/1989 | Kamasaki et al. | 257/749 |
| 4,980,754 A | * | 12/1990 | Kotani et al. | 257/716 |
| 5,117,117 A | * | 5/1992 | Oae et al. | 250/492.2 |
| 6,045,975 A | * | 4/2000 | Tani et al. | 430/285.1 |

OTHER PUBLICATIONS

Melvin I. Kohan, Nylon Plastics, 1973, John Wiley & Sons, pp. 392–393.*

* cited by examiner

*Primary Examiner*—John R. Lee
*Assistant Examiner*—Christopher M. Kalivoda
(74) *Attorney, Agent, or Firm*—Finnegan, Henderson, Farabow, Garrett & Dunner, L.L.P.

(57) ABSTRACT

An assembly part for constituting a unit in a vacuum column is provided with wirings and wiring terminals. Each wiring is provided on a first insulating film, and is covered with a second insulating film made of an electro-deposited polyimide film. The assembly part is used to constitute a semiconductor manufacturing system such as an electron beam exposure system.

18 Claims, 18 Drawing Sheets

ASSEMBLY PART WITH WIRING AND FOR MANUFACTURING SYSTEM, METHOD OF MANUFACTURING SUCH ASSEMBLY PART, AND SEMICONDUCTOR MANUFACTURING SYSTEM CONSTITUTED USING ASSEMBLY PART

CROSS-REFERENCE TO RELATED APPLICATION

This application is based upon and claims the benefit of priority from the prior Japanese Patent Application No. 11-271336, filed Sep. 24, 1999; the entire contents of which are incorporated herein by reference.

1. Background of the Invention

The present invention relates to an assembly part having a wiring and used for a manufacturing system, a method of manufacturing such an assembly part, and a semiconductor manufacturing system constituted using the assembly part. More particularly, the invention relates to an assembly part for a manufacturing system which is used in a vacuum column of an electron beam exposure system or the like, a method of manufacturing such an assembly part, and a semiconductor manufacturing system such as an electron beam exposure system constituted using the assembly part.

2. Description of the Related Art

In a vacuum column of an electron beam exposure system of the related art, a plurality of wiring cables are provided in an electrostatic deflector for scanning and deflect electron beams, an electromagnetic lens for converging electron beams or the like in order to supply desired voltages and currents. Such wiring cables are realized by coaxial cables on the market, e.g. JUNFLON high frequency coaxial cables manufactured by JUNKOSHA Corporation.

Each of the foregoing wiring cable comprises a core, and a dielectric film, a shielded wire, and a protector film, all of which cover the core one over another. The protector film is made of porous polytetrafluoroethylene (PTFE) film which is effective in reducing an electrostatic capacity and improving flexibility for enabling neat arrangement of wiring cables. When using such wiring cables in the vacuum column, out gassing therefrom have to be minimized in order to prevent contamination in the vacuum column. Generally, the outermost protector film is forcibly stripped off from the wiring cable, so that the wiring cable is used with a shield wire exposed. This is because the protector film usually out gases.

The foregoing electron beam exposure system seems to suffer from the following problems.

(1) Even when the protector film is stripped off from the wiring cable, the dielectric film between the core and the shield wire is relatively thick and less flexible, so that the wiring cable cannot be easily arranged in the vacuum column. With the electron beam exposure system, an electron gun, an electromagnetic lens, an electrostatic deflector, a sensor, an alignment coil and so on are housed in the vacuum column. A total of approximately 70 wiring cables are used for connecting the foregoing assembly parts, which inevitably thickens the vacuum column in order to secure a sufficient space for arranging the wiring cables. In other words, the vacuum column has to become large.

(2) The larger the vacuum column, the more increase in pumping speed and cost of assembly parts, which results in an undesirable increase in manufacturing cost of the electron beam exposure system.

SUMMARY OF THE INVENTION

The present invention has been contemplated in order to overcome the foregoing problems of the related art, and is intended to provide an assembly part for a manufacturing system in which conductive cables (wiring cables) can be neatly arranged in a reduced space. More particularly, the invention is intended to provide an assembly part which is preferable to constitute a unit in a vacuum column.

Another object of the invention is to provide an assembly part for a manufacturing system in which conductive cables (wiring cables) can be effectively and neatly arranged and which can reduce the number of components.

A further object of the invention is to provide a method of manufacturing an assembly part for a manufacturing system which can prevent out gassing in the vacuum column.

The invention is further intended to provide a semiconductor manufacturing system in which conductive cables (wiring cables) can be effectively arranged in a minimized space and which is compact, especially to provide an electron beam exposure system which can be made compact.

A final object of the invention is to provide a semiconductor manufacturing system which can reduce manufacturing cost.

According to a first feature of the invention, there is provided and assembly part for a manufacturing system, comprising at least: a body on which a unit is assembled in a vacuum column; a first insulating film provided on the body; a wiring arranged on the first insulating film; a wiring terminal provided at the wiring; and a second insulating film covering the wiring except for the wiring terminals.

The foregoing assembly part is provided with the wiring and the wiring terminal, so that no separate wiring cable is necessary. In other words, when the assembly part is assembled in the vacuum column to constitute a unit, wirings via which voltages and currents are supplied can be automatically assembled.

In the assembly part, at least the first or second insulating film is preferably an electro-deposited polyimide film, which is very dense and less flexible, and assures excellent electric insulation. The assembly part including the electro-deposited polyimide film is effective in suppressing out gassing, and preventing contamination in the vacuum column.

Further, the wiring terminal is preferably provided on the body at a position where it is connected to a wiring terminal of a mating assembly part. In the assembly part, the wiring terminal can be electrically and easily connected to a wiring terminal of another assembly unit when assembly parts are combined in the vacuum column.

According to a second feature, there is provided a method of manufacturing an assembly part comprising at least the steps of. (1) transferring and forming a first insulating film on a body which is used for assembling, the first insulating film having a predetermined shape; (2) surface-treating the first insulating film for the purpose of attracting a metallic film thereon; (3) forming an wiring on the first insulating film and forming an wiring terminal at the wiring; (4) at least surface-treating the wiring; and (5) forming a second insulating film covering the wiring.

Alternatively, the foregoing step (1) may be replaced by forming a mask on a body for assembling a unit in a vacuum column, and selectively forming a first insulating film on the exposed area of the mask.

In this method, at least the wiring is formed after the first insulating film is surface-treated. And the second insulating film is formed after surface-treating the wiring. Therefore, the wirings and first insulating film or second insulating film are in very close contact with one another without any space therebetween, which is effective in preventing out gassing in the vacuum column.

In accordance with a third feature of the invention, there is provided a semiconductor manufacturing system comprising at least a vacuum column and a unit constituted by an assembly part assembled in the vacuum column, wherein the assembly part includes: a body; a first insulating film provided on the body; a wiring provided on the first insulating film; a wiring terminal provided at the wiring; and a second insulating film covering the wiring except for the wiring terminal.

With the foregoing semiconductor manufacturing system, the assembly part is provided with the wiring and the wiring terminal, so that no separate wiring cable is necessary. In other words, when the assembly part is assembled in the vacuum column to constitute a unit, a wiring via which voltages and currents are supplied can be automatically assembled. Therefore, it is not necessary to prepare a space for a wiring cable, which is effective in reducing the size and a manufacturing cost of the semiconductor manufacturing system.

According to a fourth feature, there is provided an electron beam exposure system comprising at least: a vacuum column; at least a unit such as an electronic lens, a deflector or an electro-optical component housed in the vacuum column; a first insulating film provided on the unit; a wiring provided on the first insulating film; a wiring terminal provided at the wiring; and a second insulating film covering the wiring except for the wiring terminal.

Here, the term "electronic lens" refers to an electromagnetic lens and an electrostatic lens.

Further, there is provided an electron beam exposure system comprising at least: a vacuum column; an electromagnetic lens and an electrostatic deflector housed in the vacuum column; a lens stand for holding the electromagnetic lens thereon; a deflector stand for holding the electrostatic deflector; a first wiring provided on the electromagnetic lens via a first insulating film and including a first wiring terminal; a second wiring provided via the first insulating film on the lens stand at a position for mounting the electromagnetic lens, and including a second wiring terminal electrically connected to the first wiring terminal; a third wiring provided on the electrostatic deflector via the first insulating film, and including a third wiring terminal; and a fourth wiring provided on the deflector stand at a position for mounting the electrostatic deflector via the first insulating film, and including a fourth wiring terminal electrically connected to the third wiring terminal.

In the foregoing electron beam exposure system, at least a unit such as an electron lens, a deflector, an electronic optical unit, an electromagnetic lens, an electrostatic deflector, a lens stand or a deflector stand is provided with the wiring, so that no separate wiring cable is necessary.

Usually, each unit in the vacuum column requires ten-odd to several-ten wiring cables. However, most or all of such wirings can be replaced by the wiring and so on arranged on the assembly part. This does not need to arrange wiring cables, and makes the electronic beam exposure system more compact. The compact electron beam exposure system has a minimum number of components and can be manufactured at a reduced cost.

Further, the electromagnetic lens is attached on the lens stand, which allows an electrical connection between the first wiring terminal of the electromagnetic lens and the second wiring terminal of the lens stand. When the electrostatic deflector is attached on the deflector stand, an electrical connection is made between the third wiring terminal of the electrostatic deflector and the fourth wiring terminal of the deflector stand. In other words, when the unit is assembled, its wiring is electrically connected, which facilitates assembling work of the electron beam exposure system.

DESCRIPTION OF THE PREFERRED EMBODIMENTS

The invention will be described with reference to preferred embodiments of the invention.

Basic Configuration of Assembly Part of Manufacturing System

Figure 1:
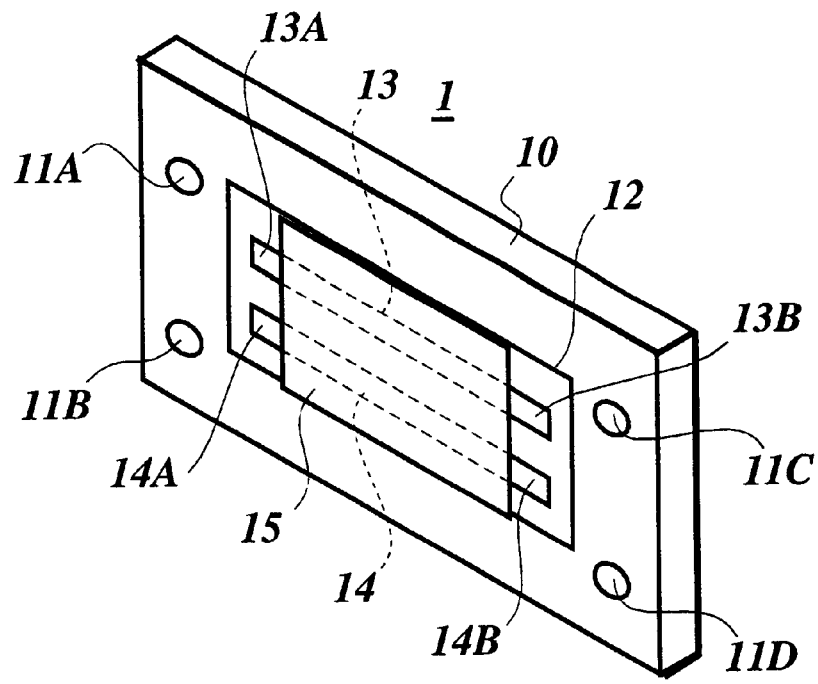
FIG. 1 is a perspective view showing the basic structure of an assembly part of a manufacturing system.

Referring to FIG. 1, an assembly part 1 of an embodiment comprises: a body 10 for assembling a unit in a vacuum column; a first insulating film 12 formed on the body 10; wirings 13 and 14 formed on the first insulating film 12; wiring terminals 13A and 13B arranged at the wiring 13; wiring terminals 14A and 14B arranged on the wiring 14; and a second insulating film 15 for covering the wirings 13 and 14 except for the wiring terminals 13A, 13B, 14A and 14B.

The body 10 is made of a metallic plate of phosphorous bronze or the like, and is provided with bolt holes 11A, 11B, 11C and 11D at the opposite sides thereof.

The first insulating film 12 is directly formed on the body 10 at the center thereof. In this embodiment, the first insulating film 12 is an electro-deposited polyimide film, which is dense, and has low flexibility and high electric insulation performance. Therefore, the first insulating film 12 seldom out gases. Method of electro-deposition of the electro-deposition polyimide film will be described later.

The wirings 13 and 14 are provided by forming a metallic film on the surface of the first insulating film 12. The metallic film is made of copper (Cu), aluminum (Al), aluminum alloy (Al—Si, Al—Cu, Al—Cu—Si) or gold (Au).

The wiring 13 has at its opposite ends the wiring terminals 13A and 13B as integral parts, which are made of the same material as that of the wirings and are flush with them. The wiring terminal 13A is electrically connected to a wiring terminal 23A of an assembly part 2 shown in FIG. 2, when the assembly part 1 is assembled with the assembly part 2. The wiring terminal 13B is electrically connected to a wiring terminal 33A of an assembly part 3 shown in FIG. 3, when the assembly part 1 is assembled with the assembly part 3.

The wiring 14 has at its opposite ends the wiring terminals 14A and 14B, which are electrically and respectively connected to wiring terminals 24A and 34A of the assembly parts 2 and 3 when the assembly part 1 is assembled with the assembly parts 2 and 3.

The second insulating film 15 is made of an electro-deposited polyimide film similarly to the first insulating film 12, protects the wirings 13 and 14, and assures high electric insulating performance. The second insulating film 15 does not extend over the wiring terminals 13A, 13B, 14A and 14B, and is smaller than the first insulating film 12.

Figure 2:
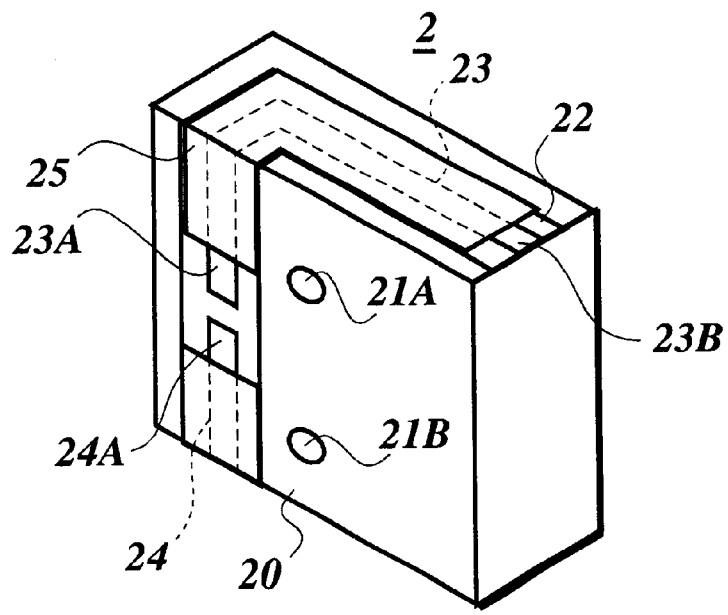
FIG. 2 is a perspective view showing the basic structure of another assembly part of the manufacturing system.

Referring to FIG. 2, the assembly part 2 includes: a body 20 for assembling a unit in the vacuum column; a first insulating film 22 formed on the body 20; wirings 23 and 24 formed on the first insulating film 22; wiring terminals 23A and 23B arranged at the opposite ends of the wiring 23; wiring terminals 24A and 24B (the wiring terminal 24B being not shown) arranged at the opposite ends of the wiring 24; and a second insulating film 25 for covering the wirings 23 and 24 except for the wiring terminals 23A, 23B, 24A and 24B.

The body 20 is made of a thick metallic plate compared with the body 10 of the assembly part 1, and has bolt-screw holes 21A and 21B which are used to assemble a unit in a vacuum column.

As shown in FIG. 2, the first insulating film 22 extends from a side surface to a top surface of the body 20, and is made of the same material as that of the first insulating film 12 of the assembly part 1.

The wirings 23 and 24 are identical to the wirings 13 and 14. The wiring 23 extends from the side surface to the top surface of the body 20, i.e. extends over at least two surfaces of the body 20, and has the wiring terminal 23A on the side surface, and the wiring terminal 23B on the top surface. The wiring 24 extends from the side surface to the bottom of the body 20, and has the wiring terminal 24A on the side surface, and the wiring terminal 24B (not shown) on the bottom.

The second insulating film 25 is made of an electro-deposited polyimide film similarly to the first insulating film 22.

Figure 3:
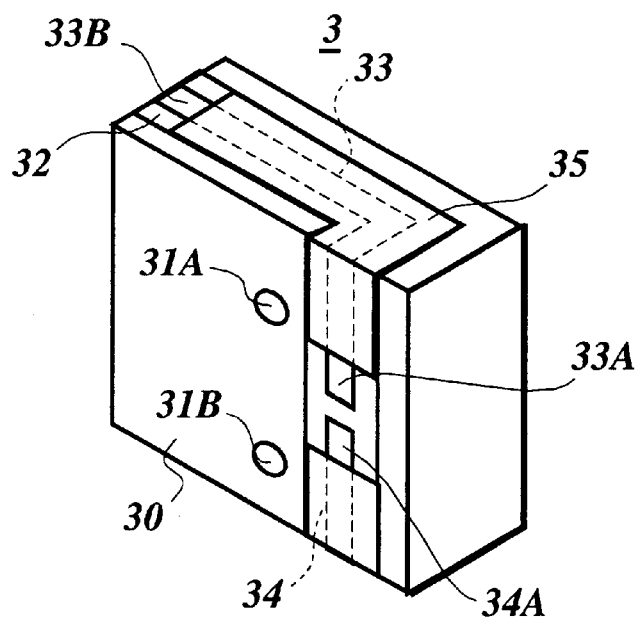
FIG. 3 is a perspective view showing the basic structure of a further assembly part of the manufacturing system.

Referring to FIG. 3, the assembly part 3 is similar to the assembly part 2, and includes: a body 30 for assembling a unit in the vacuum column; a first insulating film 32 formed on the body 30; wirings 33 and 34 formed on the first insulating film 32; wiring terminals 33A and 33B arranged at the opposite ends of the wiring 33; wiring terminals 34A and 34B (the wiring terminal 34B being not shown) arranged at the opposite ends of the wiring 34; and a second insulating film 35 extending over the wirings 33 and 34 except for the wiring terminals 33A, 33B, 34A and 34B.

The body 30 is made of a thick metallic plate similarly to the body 20 of the assembly part 2, and has bolt-screw holes 31A and 31B which are used to assemble a unit in a vacuum column.

Referring to FIG. 3, the first insulating film 32 extends from a side surface to a top surface of the body 30, and is made of the same material as that of the first insulating film 12 of the assembly part 1.

The wirings 33 and 34 are identical to the wirings 13 and 14. The wiring 33 extends from the side surface to the top surface of the body 30, and has the wiring terminal 23A on the side surface, and the wiring terminal 33B on the top surface. The wiring 34 extends from the side surface to the bottom of the body 30, and has the wiring terminal 34A on the side surface, and the wiring terminal 34B on the bottom.

The second insulating film 35 is made of an electro-deposited polyimide film similarly to the first insulating film 32.

Figure 4:
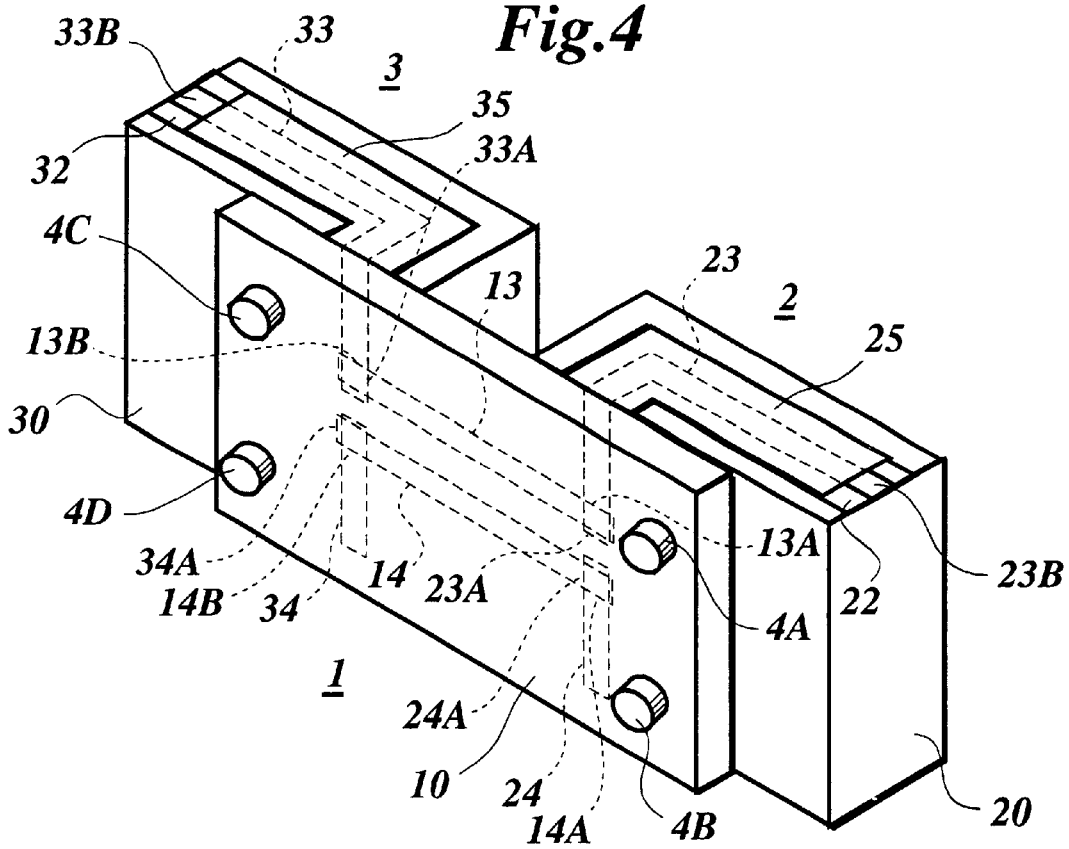
FIG. 4 is a perspective view showing assembled assembly parts.

As shown in FIG. 4, the assembly part 1 is coupled to the assembly parts 2 and 3. Specifically, the body 10 of the assembly part 1 is attached to the body 20 of the assembly part 2 by fastening a bolt 4A into the bolt hole 11A and bolt-screw hole 21A and a bolt 4B into the bolt hole 11B and bolt-screw hole 21B. Further, the body 10 is attached to the body 30 of the assembly part 3 by fastening a bolt 4C into the bolt hole 11C and bolt-screw hole 31A, and a bolt 4D into the bolt hole 11D and volt-screw hole 31B.

When the assembly parts 1 and 2 are coupled, the wiring terminals 13A and 14B of the assembly part 1 are electrically connected to the wiring terminals 23A and 24A of the assembly part 2. The wirings 13 and 23 are connected, while the wirings 14 and 24 are connected. Further, when the assembly parts 1 and 3 are coupled, the wiring terminals 13B and 14B of the assembly part 1 are electrically connected to the wiring terminals 33A and 34A of the assembly part 3. The wirings 13 and 33 are connected, while the wirings 14 and 34 are connected.

With the assembly part 1, the body 10 includes the wirings 13 and 14, and the wiring terminals 13A, 13B, 14A and 14B, so that no separate wiring cable is necessary. In other words, when the assembly part 1 is assembled in the vacuum column, the wirings 13 and 14 are also arranged in order to supply voltages or currents to be consumed in the vacuum column. The same holds true to the assembly parts 2 and 3.

The first and second insulating films 12 and 15 are made of the electro-deposited polyimide films and have a very high density, a reduced elasticity and high electric insulation performance. Especially, since the electro-deposited polyimide film is very dense, the assembly part 1 rarely produces any out gassing, and can prevent contamination in the vacuum column. The inventor has confirmed that the electro-deposited polyimide film has the electric insulation performance of approximately $10^{12}$ Ωcm to $10^{13}$ Ωcm. The same holds true to the first and second insulating films of the assembly parts 2 and 3.

In the assembly part 1, the wiring terminals 13A, 13B, 14A and 14B are arranged on the body 10 at the positions where they are brought into contact with the wiring terminals 23A, 24A, 33A and 34A of the assembly parts 2 and 3 (in the vacuum column). Therefore, these wiring terminals are connected to one another when the assembly part 1 is assembled to the assembly parts 2 and 3, e.g. the wiring terminal 13A is easily connected to the wiring terminal 23A, and the wirings 13 and 23 are also easily connected each other. In other words, once the assembly part 1 is assembled to the assembly parts 2 and 3, the wirings of these assembly parts are simultaneously connected, which is effective in simplifying the assembling work.

First Method of Manufacturing the Assembly Part 1

A first method of manufacturing the assembly part 1 will be described hereinafter as a typical example since the assembly part 2 and 3 are also made by the same method.

Figure 5A:
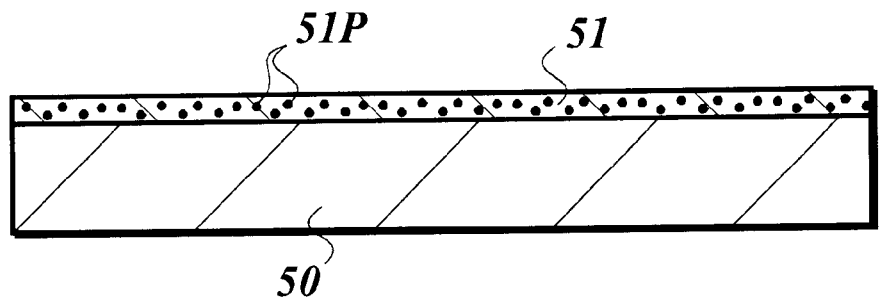
FIG. 5(A) is a sectional view of an assembly part to be manufactured according to a first method.
Figure 5B:
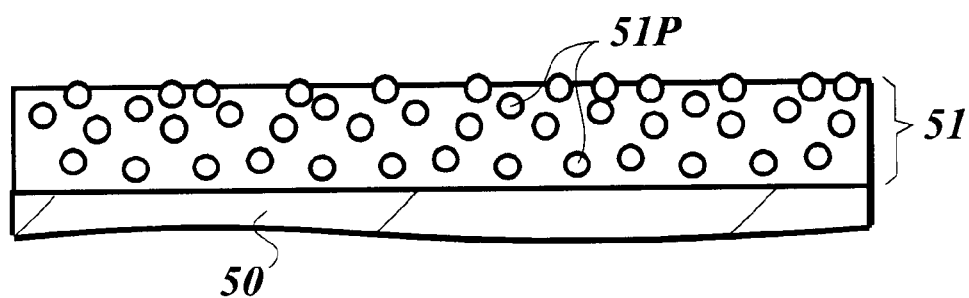
FIG. 5(B) is an enlarged sectional view of the assembly part in FIG. 5(A).

(1) First of all, a transfer substrate 50 made of a copper plate is prepared. The transfer substrate 50 is plated using a nickel (Ni) plating liquid containing polytetrafluoroethylen (PTFE) particles 51P which have a diameter of approximately several μm at maximum, so that a nickel film 51 containing polytetrafluoroethylen particles is formed on the transfer substrate 50 as shown in FIGS. 5(A) and 5(B).

Figure 6:
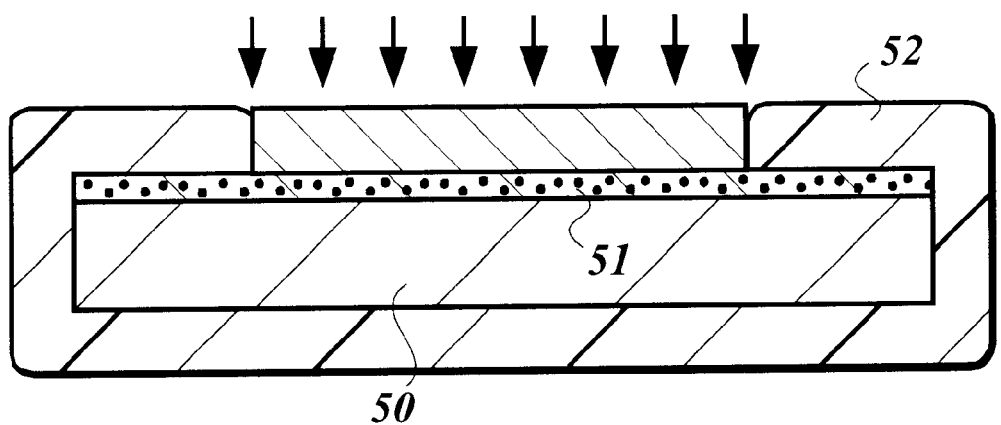
FIG. 6 is a sectional view of the assembly part, showing how the assembly part is being made in a first step of first method.

(2) A photoresist film 52 is formed on the nickel film 51 on the transfer substrate 50. A pattern of the first insulating film 12 is exposed and transferred onto the photoresist film 52 as shown in FIG. 6. The photoresist film 52 is made of a material which can serve as a mask.

Figure 7:
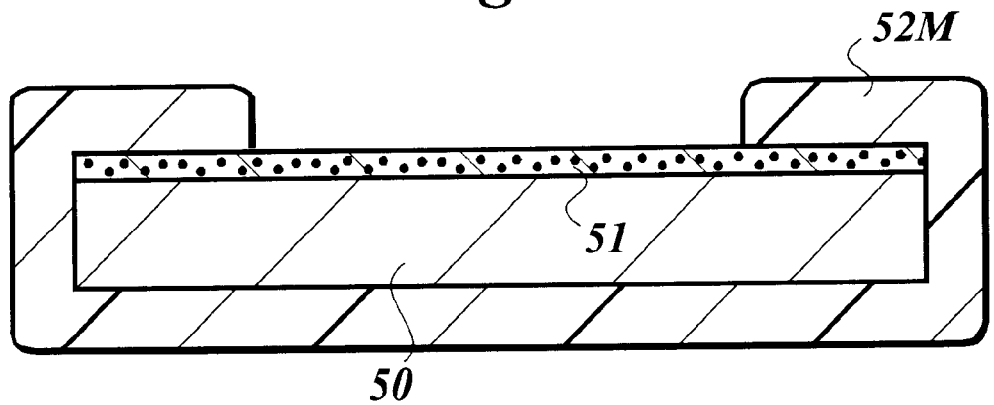
FIG. 7 is a sectional view of the assembly part, showing how it is being made in a second step following the first step shown in FIG. 6.

(3) The photoresist film 52 is developed, thereby obtaining a photoresist mask 52M on which the transferred pattern is exposed, as shown in FIG. 7.

Figure 8:
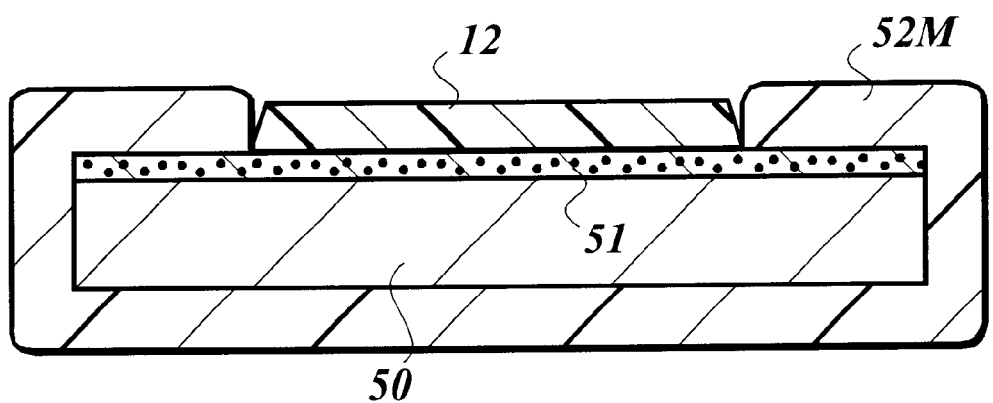
FIG. 8 is a sectional view of the assembly part, showing how it is being made in a third step after the second step shown in FIG. 7.
Figure 9:
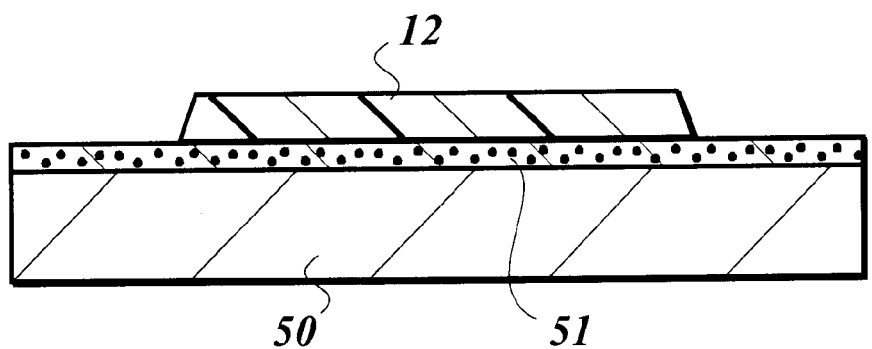
FIG. 9 is a sectional view of the assembly part, showing how it is being made in a fourth step following the third step shown in FIG. 8

(4) Referring to FIG. 8, an electro-deposited polyimide film is selectively formed on the nickel film 51 free from the photoresist mask 52M, and serves as the first insulating film 12, which is 20 μm thick, for example. Then, the photoresist mask 52M is removed, so that the transfer substrate 50 having the first insulating film 12 thereon is obtained as shown in FIG. 9. The second insulating film 15 is formed by the same method as that for the first insulating film 12.

Figure 10:
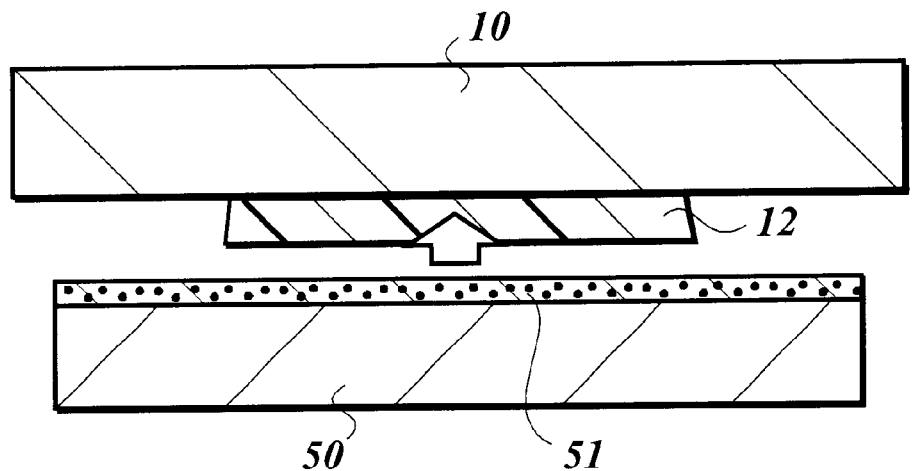
FIG. 10 is a sectional view of the assembly part, showing how it is being made in a fifth step after the fourth step shown in FIG. 9.

(5) In order to make the assembly part 1, the body 10 is prepared. The first insulating film 12 on the transfer substrate 50 is transferred onto the body 10. Refer to FIG. 10.

Figure 11:
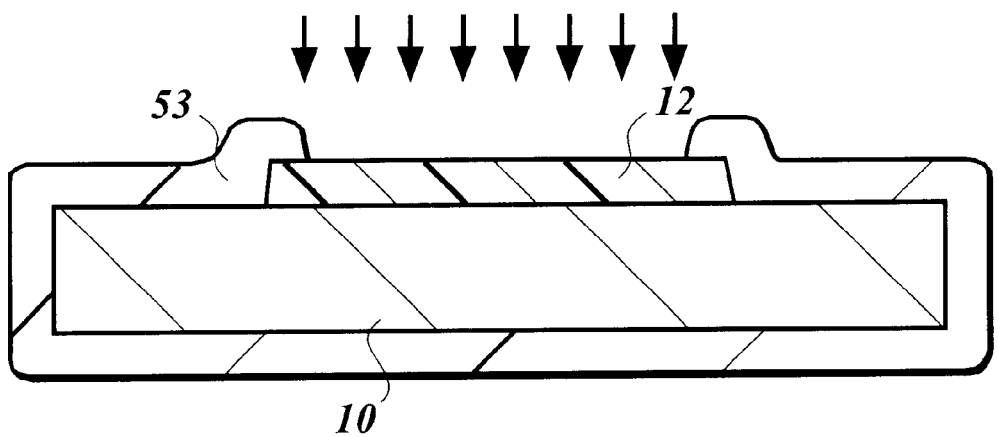
FIG. 11 is a sectional view of the assembly part, showing how it is being made in a sixth step after the fifth step shown in FIG. 10.

(6) The body 10 is covered by a mask 53 in such a manner that areas for forming the wiring terminals 13A, 13B, 14A and 14B are exposed (this step is called "masking"). Referring to FIG. 11, the first insulating film 12 which is not covered by the mask 53 is surface-treated in order to attract a metallic film thereon. For instance, the surface treatment is performed by plasma etching.

Figure 12:
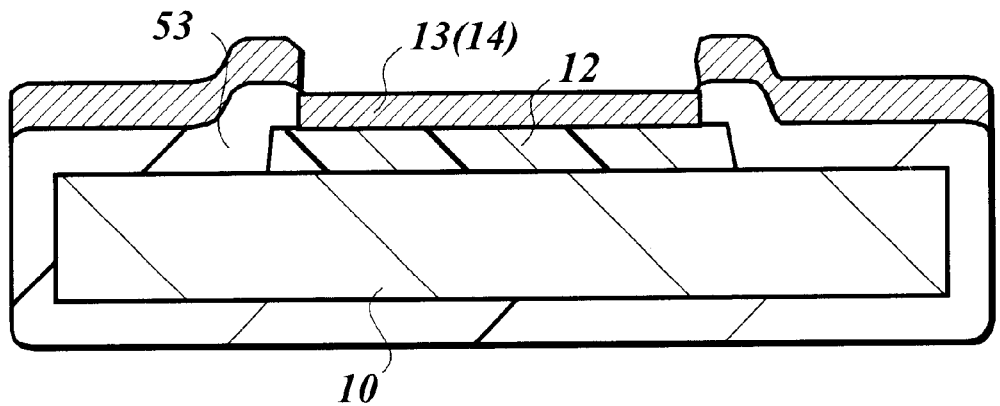
FIG. 12 is a sectional view of the assembly part, showing how it is being made in a seventh step following the sixth step shown in FIG. 11
Figure 13:
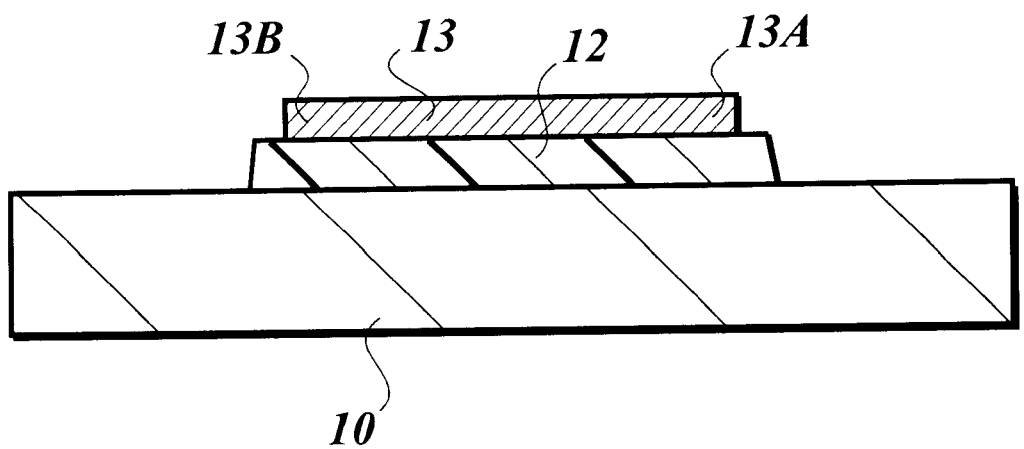
FIG. 13 is a sectional view of the assembly part, showing how it is being made in an eighth step after the seventh step shown in FIG. 12.

(7) Referring to FIG. 12, the mask 53 is used to form the wirings 13, 14 and wiring terminals 13A, 13B, 14A and 14B on the first insulating film 12, by sputtering, for example. Thereafter, the mask 53 is selectively removed, and an unnecessary film on the mask 53 is also removed as shown in FIG. 13.

Figure 14:
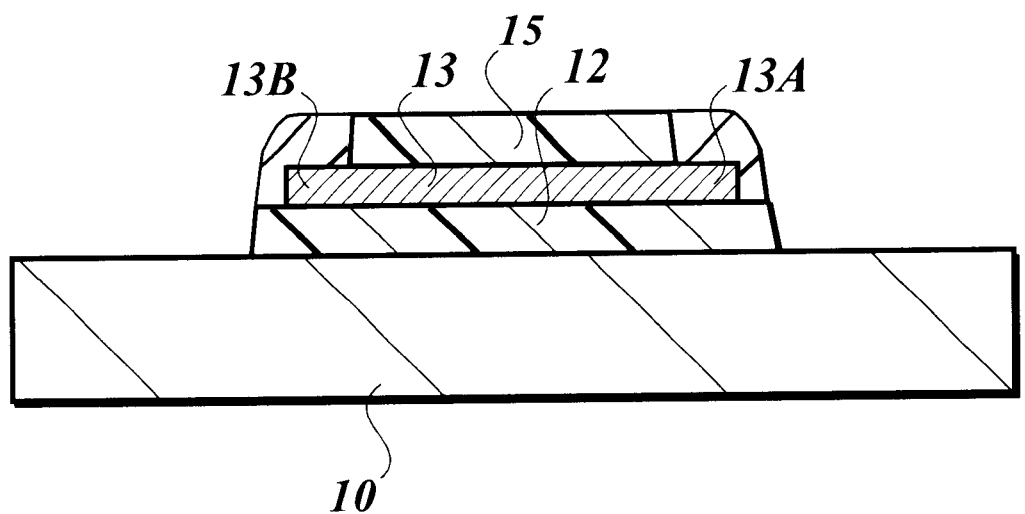
FIG. 14 is a sectional view of the assembly part, showing how it is being made in a ninth step after the eighth step shown in FIG. 13.

(8) After surface-treating the wirings 13 and 14, the second insulating film 15 is formed on these wirings as shown in FIG. 14. The second insulating film 15 is also prepared onto a transfer substrate beforehand, and is transferred onto the wirings 13 and 14 similarly to the first insulating film 12. When the second insulating film 15 is formed, the assembly part 1 is completed.

According to the foregoing method, the wirings 13 and 14 and the wiring terminals 13A, 13B, 14A and 14B are formed after the surface treatment of the first insulating film 12. The second insulating film 15 is formed at least after the surface treatment of the wirings 13 and 14. As a result, the first insulating film 12 and the wirings 13 and 14, and the second insulating film 15 and the wirings 13 and 14 are in very close contact with one another without any space therebetween, which is very effective in preventing the generation of out gassing.

Second Method of Manufacturing the Assembly Part 1

The assembly part 1 will be also made according to a second method.

Figure 15:
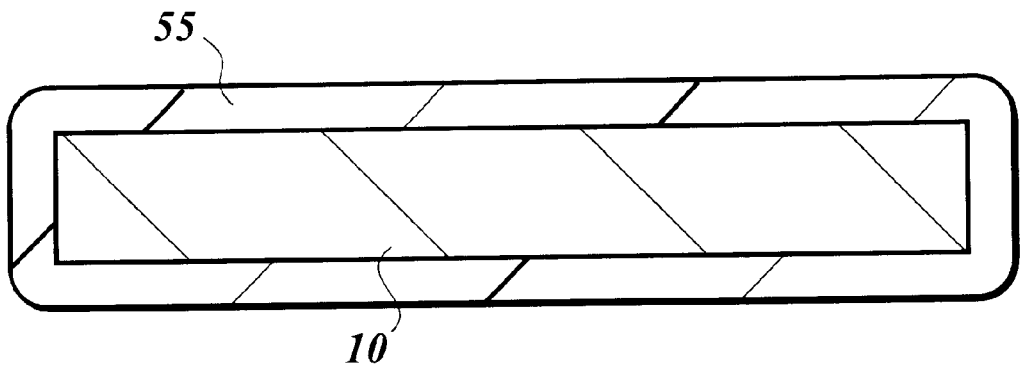
FIG. 15 is a sectional view of an assembly part, showing how the assembly part is being made in a first step of second method.

(1) First of all, a body 10 is prepared, and is covered with a photoresist film 55 as shown in FIG. 15.

Figure 16:
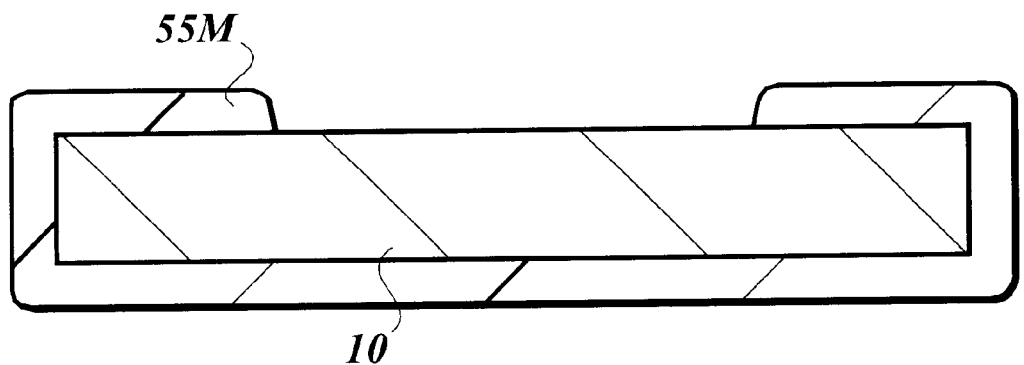
FIG. 16 is a sectional view of the assembly part, showing how it is being made in a second step after the first step shown in FIG. 15.

(2) The photoresist film 55 is exposed in order to have a pattern of the first insulating film 12 transferred thereon, and is developed, so that a photoresist mask 55M is formed as shown in FIG. 16.

Figure 17:
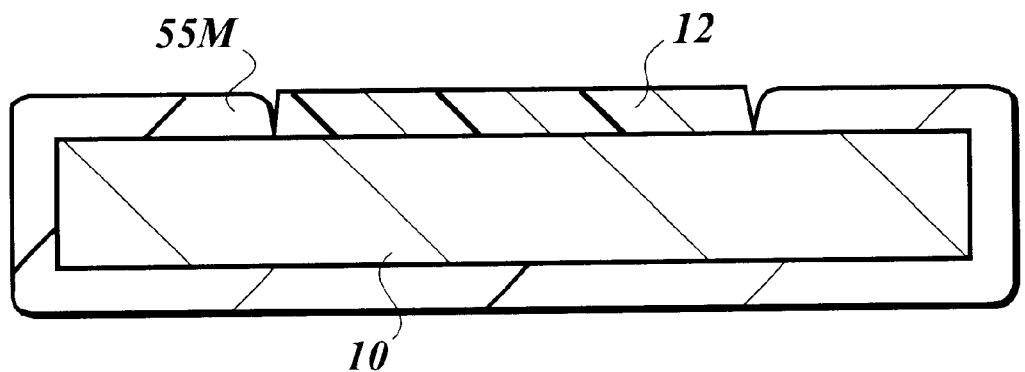
FIG. 17 is a sectional view of the assembly part, showing how it is being made in a third step after the second step in FIG. 16.

(3) Referring to FIG. 17, an electro-deposited polyimide film is selectively formed on the body 10 at an area free from the photoresist mask 55M, thereby obtaining the first insulating film 12.

Figure 18:
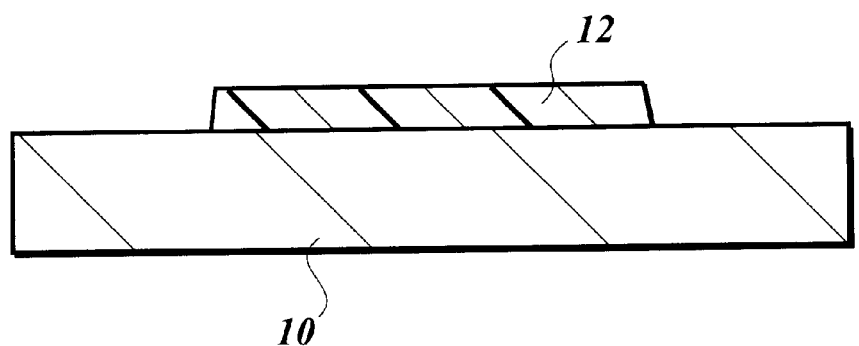
FIG. 18 is a sectional view of the assembly part, showing how it is being made in a fourth step after the third step in FIG. 17.

(4) The photoresist mask 55M is selectively removed, so that the body 10 has the first insulating film 12 thereon as shown in FIG. 18.

(5) Thereafter, the steps shown in FIG. 11 to FIG. 14 are carried out in order to complete the assembly part 1. The second insulating film 15 may be formed by the transfer process as in the first method of manufacturing, or may be formed similarly to the first insulating film 12 in the second method of manufacturing.

The assembly part 1 made according to the second method is as advantageous as the assembly part 1 made according to the first method.

Structure of Conductive Cable

The wirings 13 and 23, for example, are connected concurrently with the assembling of the assembly parts 1 to 3. Generally, currents and voltages are supplied to units for manufacturing system using the wiring 13 and so on. Conductive cables are used at positions where the foregoing wirings cannot be arranged, or used to connect adjacent wiring terminals.

Figure 19:
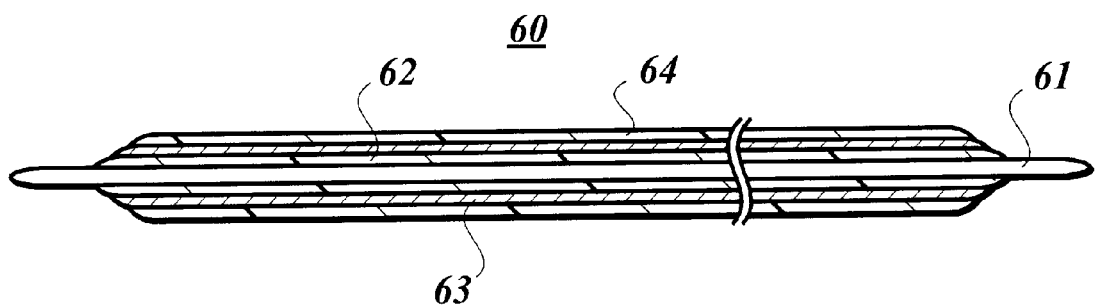
FIG. 19 is a sectional view of a conductive cable used in the invention.

Referring to FIG. 19, a conductive cable 60 is composed of a core 61, a third insulating film 62 extending over the core 61 except for the opposite ends thereof, a shield film 63 covering the third insulating film 62, and a fourth insulating film 64 covering the shield film 63.

Method of Manufacturing the Conductive Cable 60

The conductive cable 60 is made as described below.

Figure 20:
FIG. 20 is a sectional view of the conductive cable, showing how it is being made in a first step.

(1) First of all, the core 61 of the conductive cable 60 is prepared as shown in FIG. 20. The core 61 is a copper, copper alloy, aluminum, aluminum alloy or gold wire. The core 61 is cleaned in order to remove oil or the like from its surface.

Figure 21:
FIG. 21 is a sectional view of the conductive cable, showing how is being made in a second step after the first step in FIG. 20.

(2) Referring to FIG. 21, the third insulating film 62 is attached round the core 61 using the migration electro-deposition. Specifically, the core 61 is immersed in an electro-deposition bath 70 filled with a dispersion medium (i.e. an electrolyte) 71. The dispersion medium 71 is a suspension of an insulating material 71P (i.e. soluble polyimide polymer according to the invention) which is amine-denatured (i.e. positively ionized). The core 61 is connected to a negative electrode 73 of a DC (Direct current) power source 72 while a general electrode (general purpose electrode) 75 is connected to a positive electrode 74. Both the core 61 and the general electrode 75 are immersed in the electro-deposition bath 70. As a direct current is applied from the DC power source 72, the amine-denatured polymer is moved to, is adsorbed onto and coheres on the core 61. Simultaneously, a chemical reaction is carried out for the polymer to form a film. As the chemical reaction is being carried out, the polymer near the core 61 extensively coheres, and changes into a non-soluble resin, which serves as the third insulating film 62. Portions of the core 61 where the third insulating film 62 is present become non-conductive, so that formation of third insulating film 62 will be suspended. Therefore, the core 61 can be uniformly covered by the third insulating film 62.

The polyimide film of approximate 20 $\mu$m thick can be uniformly formed on the core 61 when a constant voltage is applied to a dispersion medium 71 of the soluble polyimide polymer (overall solid component being 5%, content of organic solvent being 35%, pH 5.0, BF viscosity being 5 mPa s, and grain diameter being 0.3 $\mu$m). Specifically, the voltage is increased for 10 seconds until a set voltage of 30 V is obtained, and 30 V is held for 50 seconds. Thereafter, the third insulating film 62 is dried for 10 minutes at 80° C., and is baked for 30 minutes at 250° C. This third insulating film 62 has an electric insulation performance of approximately $10^{16}$ $\Omega$cm. As a result, when the conductive cable 60 is wound in coils, the third insulation film 62 enables adjacent cores 61 to have an insulation resistance of approximately 200 V.

(3) The third insulation film 62 is surface-treated, e.g. is plasma-etched, in order to attract metal ions, so that OH radical is formed on the third insulating film 62.

Figure 22:
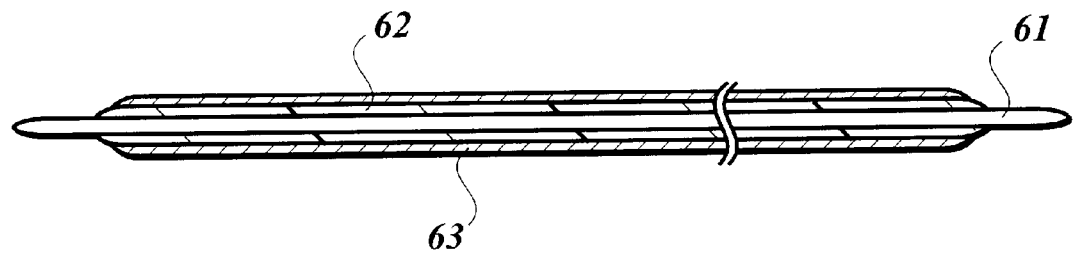
FIG. 22 is a sectional view of the conductive cable, showing how is being made in a third step after the second step in FIG. 21.
Figure 23:
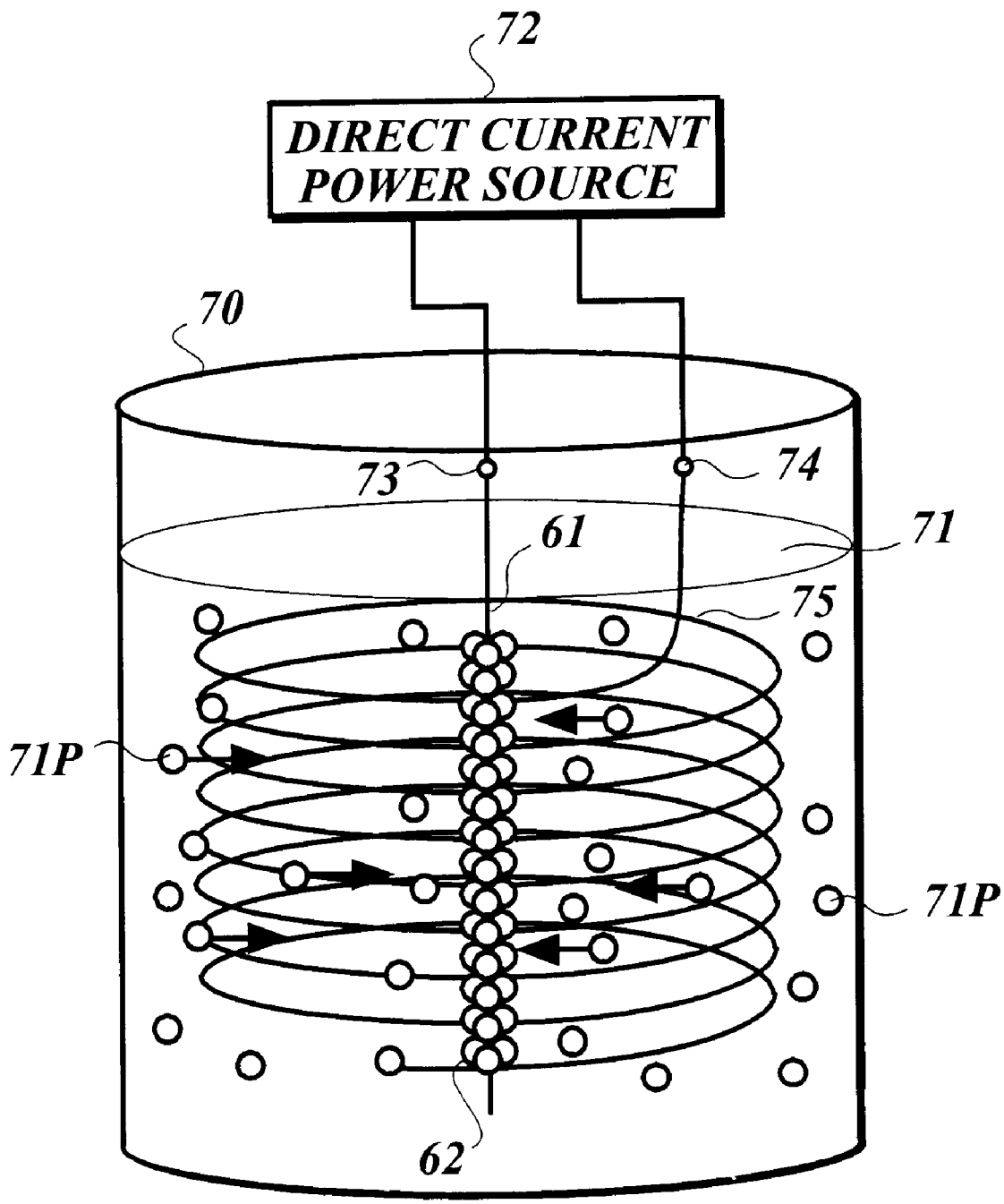
FIG. 23 is a schematic view for describing the migration electrodepositing method utilized in the invention.
Figure 24:
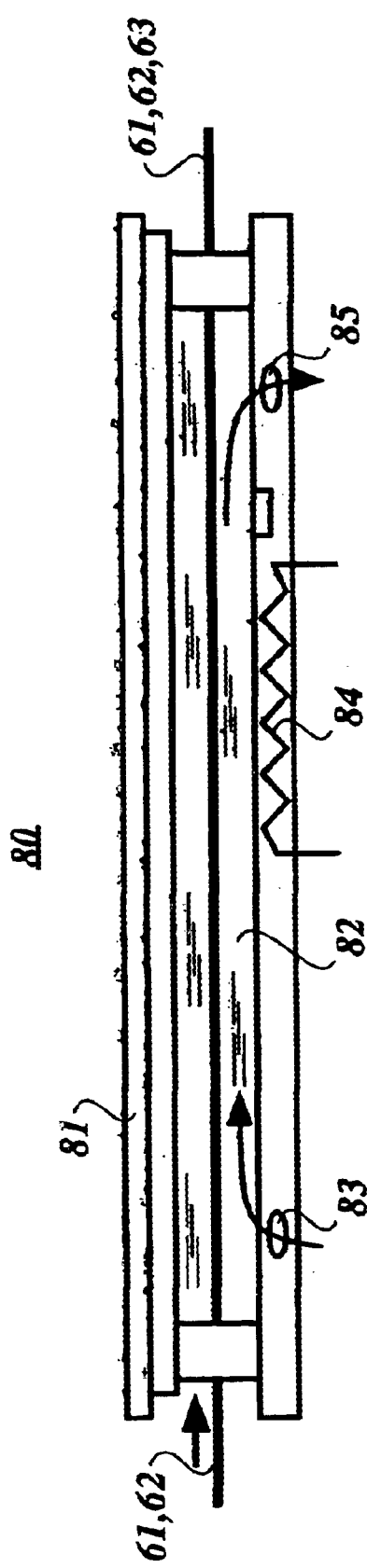
FIG. 24 is a schematic view showing the configuration of a shield film forming system according to the invention.

(4) A shield film 63 is formed on the third insulation film 62 as shown in FIG. 22. The shield film 63 is made by a shield film forming device 80 shown in FIG. 24. In the shield film forming device 80, the core 61 (covered with the third insulating film 62) is put into a narrow reaction cell 81. Thereafter, the reaction cell 81 is filled with a treatment liquid 82 obtained by mixing a reactant (i.e. an aqueous solution containing $Fe^{2+}$ or other metal ions) and an oxidizing solution (i.e. aqueous liquid containing $NO^{2-}$ ions or the like), so that the shield film 63 made of ferrite will be formed on the third insulating film 62. In this case, the reactant and the oxidizing solution are mixed immediately before they are poured into the reaction cell 81 via an inlet 83. The core 61 is heated by a heater 84 to a temperature of 60° C. to 90° C. Ferrite plating reaction is started on the surface of the third insulating film 62 of the heated core 61. Ferrite particles which are directly deposited into the treatment liquid 82 as by-products are discharged via a waste outlet 85, so that the shield film 63 is protected against ferrite particles sticking thereto, and aging. When the shield film 63 uniformly extends over the third insulating film 62, no OH radicals that attract metal ions are exposed, which suspends the formation of the shield film 63. If it is necessary to further thicken the shield film 63, electrolytic plating is conducted using the existing shield film 63 as one electrode.

(5) Then, a fourth insulating film 64 is formed on the shield film 63 as described with respect to the formation of the third insulating film 62. This completes the conductive cable 60.

This conductive cable 60 is composed of the core 61 covered by the third insulating film 62, shield film 63 and fourth insulating film 64, all of which are laid over one after another. Therefore, the thickness of the core 61 can be determined as desired in accordance with specifications such as current capacity, and so on.

Further, each of the third insulating film 62, shield film 63 and fourth insulating film 64 is approximately several tens $\mu$m to several hundreds $\mu$m thick, so that the conductive cable 60 is very flexible, which enables it to be arranged with ease.

Further, it is possible to compose the third insulating film 62, shield film 63 and fourth insulating film 64 of the conductive cable 60 using the materials having excellent vacuum resistance. Still further, the foregoing films 62, 63 and 64 are laid over one after another and are in close contact with one another without any spaces therebetween, which is effective in preventing out gassing in the vacuum chamber.

Application of the Invention to Semiconductor Manufacturing System (an Electron Beam Exposure System)

The present invention is applied to the electron beam exposure system for manufacturing a semiconductor as described hereinafter.

(1) Overall Configuration of the Electron Beam Exposure System

Figure 25:
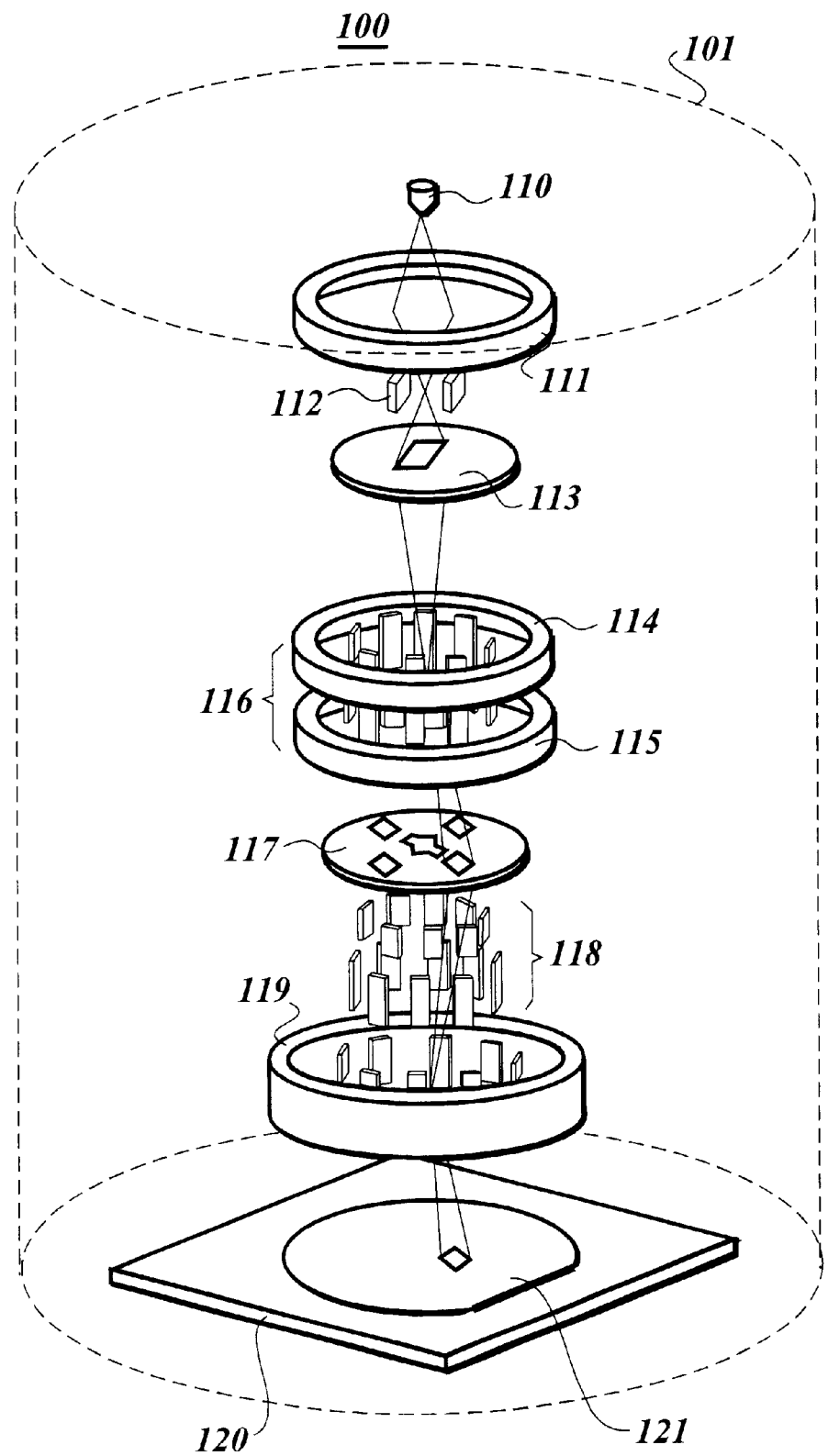
FIG. 25 is a schematic view showing the configuration of an electron beam exposure system according to the invention.

Referring to FIG. 25, the electron beam exposure system 100 comprises a vacuum device 101. The vacuum unit 101 includes: an electron gun 110; a condenser lens 111; a blanker 112; a first shaping aperture 113; a first projection lens 114; a second projection lens 115; an 8-pole type shaping deflector 116; a character aperture 117; a 2-stage type main/sub deflector 118; and an objective lens 119. In the vacuum device 101, the foregoing components are vertically arranged in the flowing direction of the electron beams. A stage 120 is positioned under the objective lens 119 in order to hold a substrate 121 to be treated.

In this embodiment, a semiconductor wafer is used as the substrate 121 to be treated, and is coated with an EB (electron beam) resist film (not shown) for the electron beam exposure. A predetermined pattern is depicted on the EB resist film by the electron beam exposure system 100. Alternatively, an EB mask blank including a shield film formed on a transparent quartz glass substrate is usable as the substrate 121. An EB resist film is applied onto a photo-mask blank. The electron beam exposure system depicts the predetermined pattern on the EB resist film. In addition, the substrate 121 is also applicable to patterning of wiring substrates, quartz panels and so on.

The electron beam exposure system 100 further includes an electromagnetic lens 200 for the condenser lens 111, first projection lens 114 and second projection lens 115, and an electrostatic deflector 300 for the blanker 112, shaping deflector 116, and main/sub deflector 118. A mechanical moving object lens (MMOL) structure is used for a lens stand for the objective lens 119 to be described later, so that the objective lens 119 is realized by an electrostatic lens as the objective lens 119. The objective lens 119 is one of the essential components of the electron beam exposure system 100.

(2) Structures of Electromagnetic Lens and Lens Stand

Figure 26A:
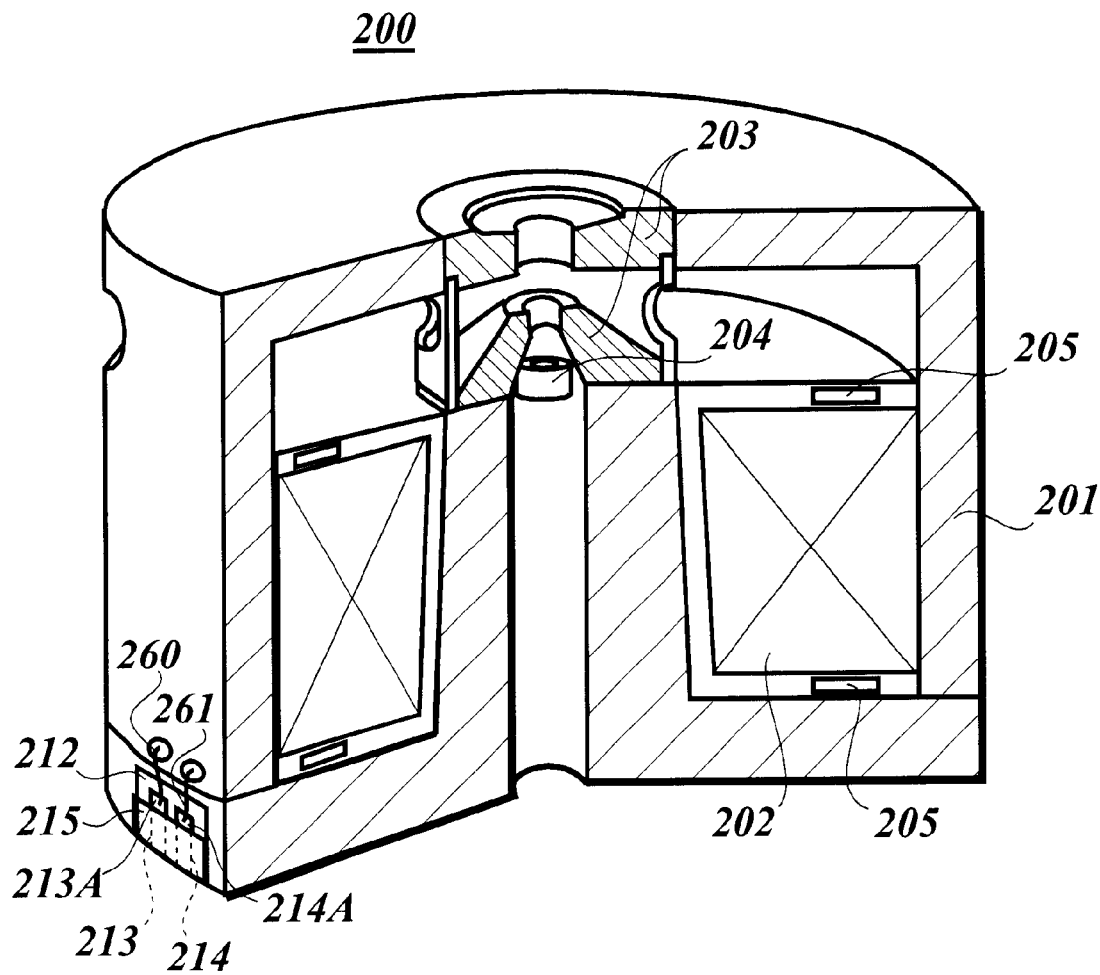
FIG. 26(A) is a perspective, partly sectional view of an electromagnetic lens used in the electron beam exposure system.
Figure 26B:
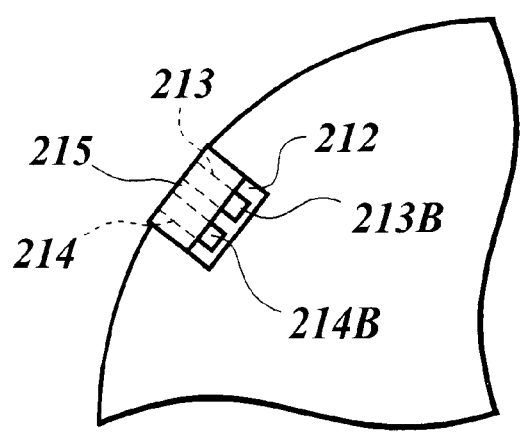
FIG. 26(B) is a bottom view of the electromagnetic lens, observed in the direction of arrow F26B in FIG. 26(A).

Referring to FIGS. 26(A) and 26(B), the electromagnetic lens 200 includes at least a cylindrical magnetic yoke 201, and an exciting coil 202, a pole piece 203, a stigmator 204 and a water-cooled jacket 205, all of which are housed in the magnetic yoke 201 (assembly part).

The foregoing wirings 213 and 214, and conductive cables 260 and 261 are provided on the electromagnetic lens 200, specifically to the magnetic yoke 201.

Specifically, the wirings 213 and 214 are provided on a first insulating film 212 on the magnetic yoke 201, and are covered by a second insulating film 215. A wiring terminal 213A at one end of the wiring 213 is arranged on a side surface of the electromagnetic lens 200, and is electrically connected to an exciting coil 202 via a conductive cable 260. Further, a wiring terminal 214A at one end of the wiring 214 is arranged on the surface of the electromagnetic lens 200 and is electrically connected to an exciting coil 202 via a conductive cable 261. A wiring terminal 213B at the other end of the wiring 213 and a wiring terminal 214B at the other end of the wiring 214 are provided on the bottom of the electromagnetic lens 200.

Figure 27:
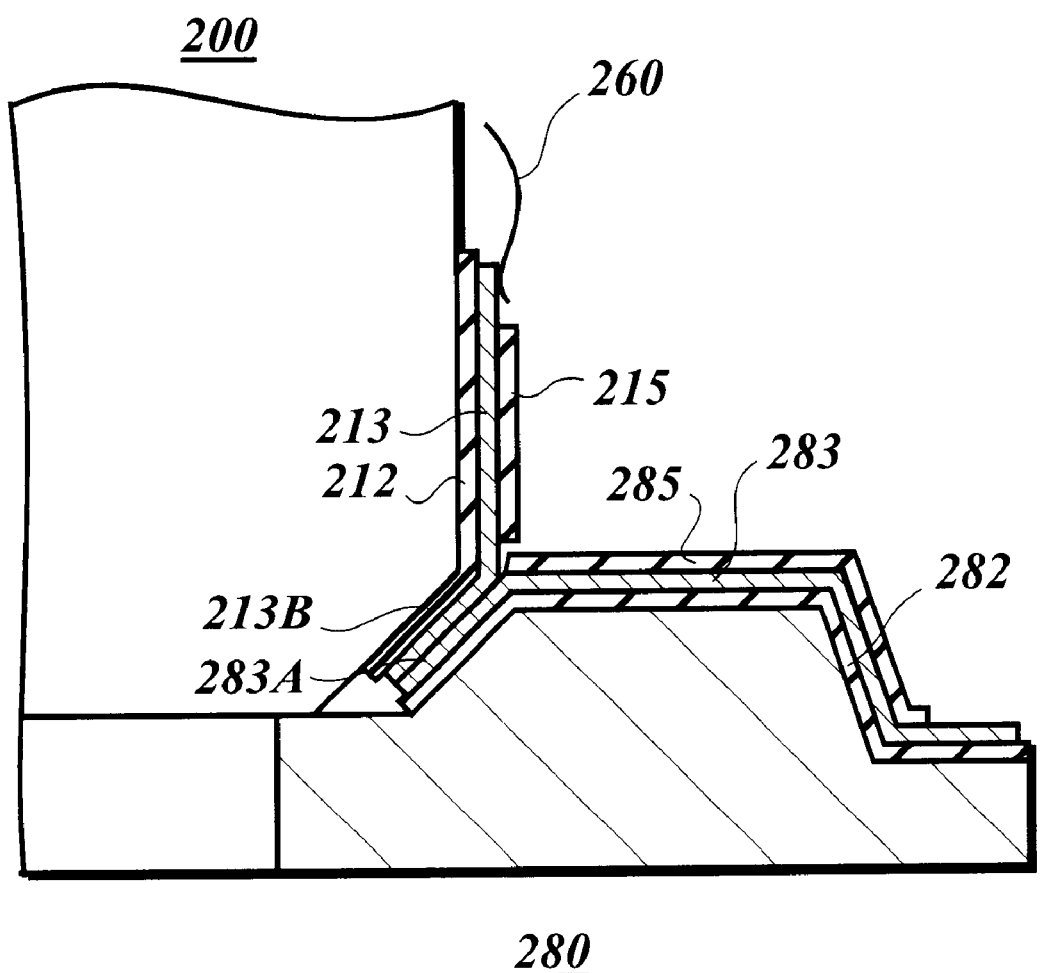
FIG. 27 is a sectional view of the electron beam exposure system, showing the essential parts (assembly parts) of the electromagnetic lens and a lens stand.

FIG. 27 is a sectional view of the essential parts of the electromagnetic lens 200 and a lens stand 280. The electromagnetic lens 200 is placed on the lens stand 280, on which a wiring 283 is provided via a first insulating film 282. The wiring 283 is identical to the wirings 213 and 214. Further, a second insulating film 285 is provided on the wiring 283. A wiring terminal 283A of the wiring 283 is electrically connected to the wiring terminal 213B when the electromagnetic lens 200 is attached onto the lens stand 280. The lens stand 280 is also provided with a wiring and a wiring terminal which correspond to the wiring 214 and wiring terminal 214B and are not shown in FIG. 27.

(3) Configuration of Electrostatic Deflector and Deflector Stand Thereof

Figure 28:
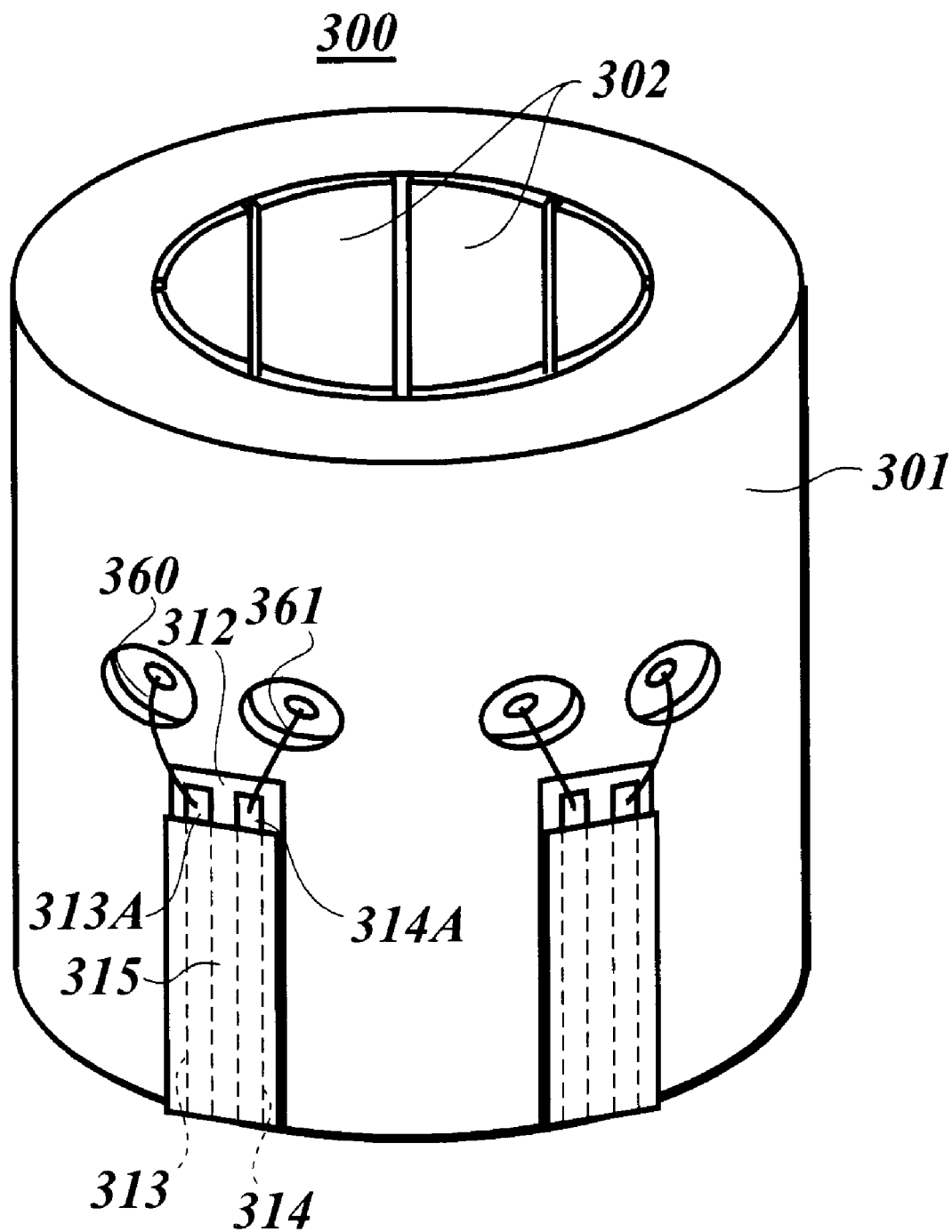
FIG. 28 is a perspective view of an electrostatic deflector of the electron beam exposure system of the invention.

Referring to FIG. 28, the electrostatic deflector 300 comprises a cylindrical alumina ceramics body 301, (i.e. an assembly part), and a plurality of gold-plated electrodes 302 provided on the inner surface of the alumina ceramics body 301. The alumina ceramics body 301 is provided with wirings 313 and 314 in accordance with the number of the gold-plate electrodes 302, and the conductive cables 360 and 361 which are identical to the foregoing wirings.

A pair of wirings 313 and 314 are formed on a first insulating film 312 on the alumina ceramics body 301. Further, a second insulating film 315 is formed on the wirings 313 and 314. A terminal wiring 313A at one end of the wiring 313 is provided on the surface of the alumina ceramics body 301, and is electrically connected to one of gold-plated electrodes 302 via a conductive cables 360 and a conductive wiring (a conductive through hole wiring) 303 (shown in FIG. 29) which is embedded in the alumina ceramics body 301. A terminal wiring 314A at one end of the wiring 314 is also provided on the surface of the alumina ceramics body 301, and is electrically connected to one of gold-plated electrode 302 via a conductive cable 361 and conductive wiring (a conductive through hole wiring) 303 which is embedded in the alumina ceramics body 301. A wiring terminal 313B (shown in FIG. 29) at the other end of the wiring 313 and a wiring terminal 314B at the other end of the wiring 314 are provided on the bottom of the alumina ceramics body 301.

Figure 29:
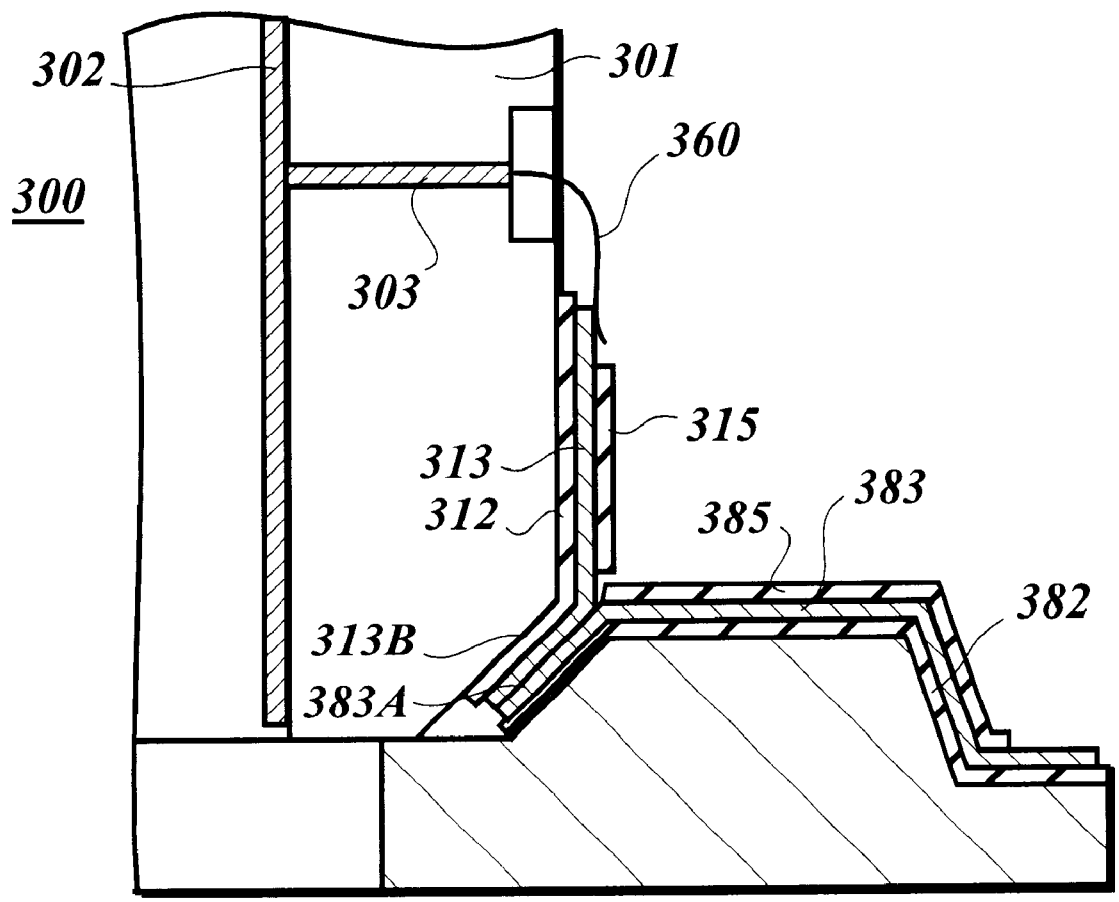
FIG. 29 is a sectional view of the essential parts (assembly parts) of the electrostatic deflector and a deflector stand of the electron beam exposure system of the invention.

Referring to FIG. 29, the deflector stand 380 is designed so as to hold the electrostatic deflector 300 thereon, and is provided with a wiring 383 which is identical to the wirings 313 and 314 and is positioned on a first insulation film 382. Further, a second insulating film 385 is formed on the wiring 383. A wiring terminal 383A of the wiring 383 is electrically connected to the wiring terminal 313B when the electrostatic deflector 300 is placed on the deflector stand 380. Although not shown, the deflector stand 380 includes a wiring and a wiring terminal corresponding to the wiring 314 and wiring terminal 314B of the electrostatic deflector 300.

(4) Structure of Objective Lens Stand (MMOL)

Figure 30A:
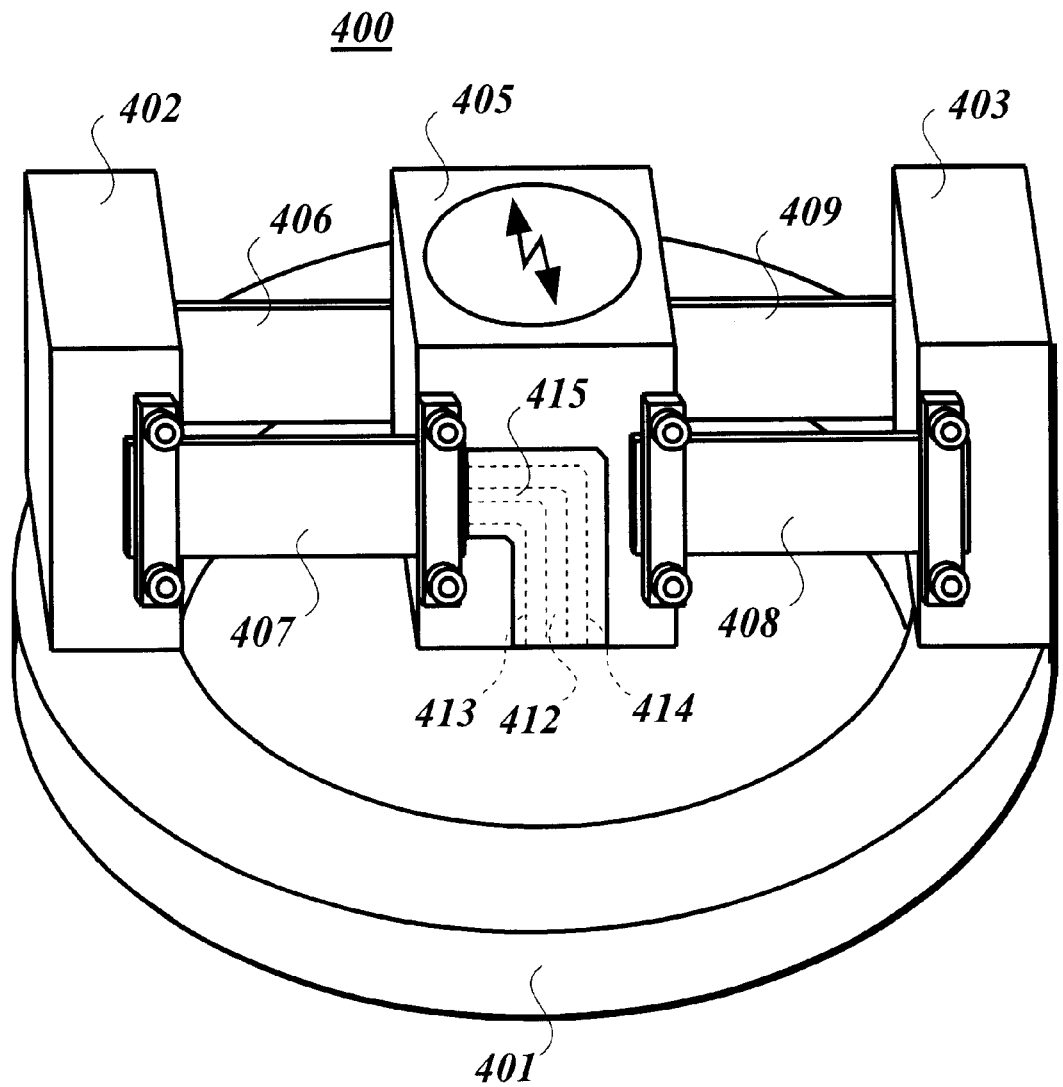
FIG. 30(A) is a perspective view of an objective lens stand of the electron beam exposure system, showing the configuration thereof
Figure 30B:
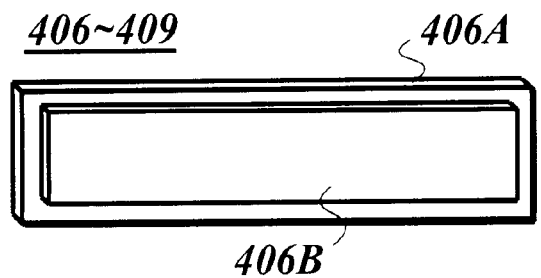
FIG. 30(B) is a schematic perspective view of an actuator for driving the objective lens stand.

Referring to FIG. 30(A), the objective lens stand 400 includes: a base ring 401; first and second supports 402 and 403 which are on the base ring 401 at positions opposite to each other; and a moving stand 405 which is connected to the first support 402 via two actuators 406 and 407, and is connected to the second support 403 via two actuators 408 and 409. As shown in FIG. 30(B), each of the four actuators 406 to 409 includes a piezoelectric element 406B stuck onto a phosphate bronze plate spring 406A, for example. When a voltage is applied to the piezoelectric element 406B, the plate spring 406A of is bent by the actuators 406 to 409, which enables the moving stand 405 to horizontally swing.

The objective lens stand 400, specifically the moving stand 405 (assembly part) constituting the objective lens stand 400, is provided with wirings 413 and 414, as described above.

The wirings 413 and 414 are formed on a first insulating film 412 on the moving stand 405. A second insulating film 415 extends over the wirings 413 and 414. Although the structure of the objective lens stand is not explicitly described, the wirings 413 and 414 are electrically connected to the piezoelectric element 406B of the actuator 406 when the actuator 406 is attached onto the moving stand 405 and support 402. This structure is similar to that of the first assembly part 1 to third assembly part 3. The foregoing holds true to the other actuators 407 to 409.

With the objective lens stand 400, a magnetic field may vary with the mechanical moving objective lens (MMOL) structure, so that an objective lens 119 constituted by an electrostatic deflector which is equivalent to the electrostatic deflector 300 is attached on the moving stand 405, and electrically connected each other in the manner similar to those of the electromagnetic lens 200 and lens stand 280, and the electrostatic deflector 300 and deflector stand 380.

In the electron beam exposure system 100 of this embodiment, at least the electromagnetic lens 200, electrostatic deflector 300, deflector stand 280 and deflector stand 380 are provided with the wirings 213, 214, 283, 284, 313, 314, 383, 384 and so on. Therefore, no separate wiring cable is required. Usually, each unit in the vacuum unit 101 requires several tens to several hundreds wiring cables. However, most or all of such wiring cables can be replaced by the wiring 213 and so on arranged on an assembly parts. This obviates the arrangement of wiring cables, and makes the electron beam exposure system 100 more compact. The compact electron beam exposure system 100 can be constituted by a reduced number of components, and be manufactured at a reduced cost.

Further, the electron beam exposure system 100 can make the vacuum unit 101 compact, which facilitates evacuation and so on, and reduces the running cost thereof Still further, when the electromagnetic lens 200 is installed on the lens stand 280, the wiring terminal 213B of the electromagnetic lens 200 is electrically connected to the wiring terminal 283A of the lens stand 280. In addition, when the electrostatic deflector 300 is installed on the deflector stand 380, the wiring terminals 313B and 383A of these units are electrically connected each other. In other words, as soon as the components are assembled, their wiring terminals are electrically connected with ease. As a result, the electron beam exposure system 100 can be easily assembled.

Modified Example

Figure 31:
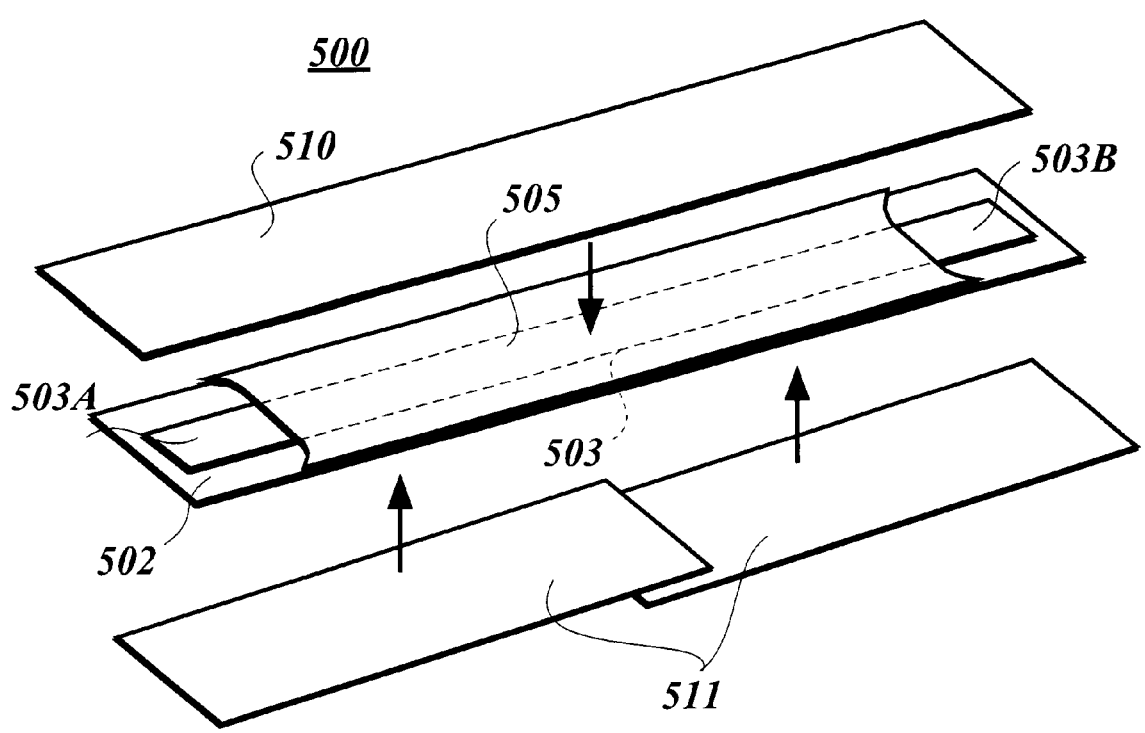
FIG. 31 is an exploded perspective view of a wiring module in a modified example of the embodiment.

In a modified example, the wirings which are fixedly provided on the assembly parts are offered in the shape of a wiring module. A necessary number of wiring modules will be prepared and installed. FIG. 31 is an exploded perspective view of such a wiring module 500.

Referring to FIG. 31, the wiring module 500 is identical to the wirings 13 and 14 of the assembly part 1 shown in FIG. 1, and includes a first insulating film 502, a wiring 503 provided on the first insulating film 502, wiring terminals 503A and 503B at the opposite ends of the wiring 503, a second insulating film 505 which is formed at least on the wiring 503, a protecting film 510 formed on the second insulating film 505, and an adhesive film 511 on the rear surface of the first insulating film 502. It is preferable that the adhesive film 511 also serves as the protector film.

Thickness and materials of the first insulating film 502, wiring 503 and second insulating film 505 are identical to those of the foregoing first insulating film 12, wiring 13 and second insulating film 15, and will not be described here.

Although certain preferred embodiments have been shown and described, it should be understood that many changes and modifications may be made when taken in conjunction with the accompanying drawings in which preferred embodiments of the present invention are shown by way of illustrative example.

The present invention has been described assuming that it is applied to an electron beam exposure system as a semiconductor manufacturing system. However, the invention is applicable to vacuum columns and units housed in the vacuum columns, and is specifically applicable to a semiconductor manufacturing system which includes at least an electronic lens, deflector or electronic optical components. In this case, the term "electronic lens" refers to a magnetic lens and an electrostatic lens. The invention is preferable to a vacuum column having a number of conductive cables. For instance, the invention is especially preferable to systems for manufacturing and testing an ion beam etching system, a reactive ion beam etching system or a scanning electron microscope which supplies voltages and currents necessary for controlling beams.

It should be noted that the invention is applicable to various embodiments which are not described in the specification. The technical scope of the invention should be determined by the appended claims.

The invention can provide the assembly parts which enable neat arrangement of wiring cables, and particularly the assembly parts which are effective in assembling parts in a vacuum column.

The invention provides the assembly parts that allow neat and economical arrangement of the wiring cables, and can reduce the number of components.

The manufacturing system of the invention can prevent out gassing.

The invention provides the assembly parts that can reduce spaces for arranging the wiring cables and be compact. Especially, the invention provides the electron beam exposure system which can be made compact.

Finally, the invention provides the semiconductor manufacturing system which can be manufactured at a reduced cost.

What is claimed is:

1. An assembly part for a manufacturing system, comprising:
    a body on which a unit is assembled in a vacuum column;
    a first insulating film provided on the body;
    a wiring arranged on the first insulating film;
    a wiring terminal provided at the wiring in a position for direct connection to another assembly part; and
    a second insulating film covering the wiring except for the wiring terminals.

2. The assembly part of claim 1, wherein either the first or second insulating film is an electro-deposited polyimide film.

3. The assembly part of claim 2, wherein either the first or second insulating film has a resistance of $10^{12}$ $\Omega$cm to $10^{13}$ $\Omega$cm.

4. The assembly part of claim 3, wherein either the first or second insulating film is 15 $\mu$m to 25 $\mu$m thick.

5. The assembly part of claim 1, wherein the first insulating film is larger than the second insulating film.

6. The assembly part of claim 1, wherein the wiring terminal is provided on the body at a position for connection to a wiring terminal of another assembly part.

7. The assembly part of claim 1, wherein the wiring terminal is integral with at least one end of the wiring.

8. The assembly part of claim 7, wherein the wiring and the wiring terminal are made of copper, copper alloy, aluminum, aluminum alloy or gold.

9. The assembly part of claim 1, wherein the body is made of metal.

10. The assembly part of claim 1, wherein the body is provided with bolt holes or bolt-screw holes for assembling.

11. The assembly part of claim 6, wherein the wiring extends over one surface or at least two surfaces of the body.

12. The assembly part of claim 1, wherein the first insulating film is formed on the body via an adhesive film, and the second insulating film is covered by a protective film.

13. A semiconductor manufacturing system comprising:

a vacuum column and a unit constituted by an assembly part assembled in the vacuum column, wherein the assembly part includes: a body; a first insulating film provided on the body; a wiring provided on the first insulating film; a wiring terminal provided at the wiring in a position for direct connection to another assembly part; and a second insulating film covering the wiring except for the wiring terminal.

14. The semiconductor manufacturing system of claim 13, wherein at least the first or second insulating film is an electro-deposited polyimide film.

15. The semiconductor manufacturing system of claim 14, further comprising a conductive cable which is constituted by a core, a third insulating film covering the core, a shield film covering the third insulating film and a fourth insulating film covering the shield film, and is electrically connected to the wiring terminal.

16. The semiconductor manufacturing system of claims 15, wherein at least the third or fourth insulating film is an electro-deposited polyimide film.

17. An electron beam exposure system comprising:

a vacuum column;

at least a unit such as an electronic lens, a deflector or an electro-optical component housed in the vacuum column;

a first insulating film provided on the unit;

a wiring provided on the first insulating film;

a wiring terminal provided at the wiring in a position for direct connection to another unit; and a second insulating film covering the wiring except for the wiring terminal.

18. An electron beam exposure system comprising:

a vacuum column;

an electromagnetic lens and an electrostatic deflector housed in the vacuum column;

a lens stand for holding the electromagnetic lens thereon;

a deflector stand for holding the electrostatic deflector;

a first wiring provided on the electromagnetic lens via a first insulating film and including a first wiring terminal;

a second wiring provided on the lens stand via the first insulating film, and including a second wiring terminal formed in a position for direct connection to the electromagnetic lens and electrically connected to the first wiring terminal;

a third wiring provided on the electrostatic deflector via the first insulating film and including a third wiring terminal; and a fourth wiring provided on the deflector stand via the first insulating film, and including a fourth wiring terminal formed in a position for direct connection to the electrostatic deflector and electrically connected to the third wiring terminal.

* * * * *